United States Patent
Fujiwara

(10) Patent No.: US 6,496,350 B2
(45) Date of Patent: Dec. 17, 2002

(54) ELECTROSTATIC WAFER CHUCKS AND CHARGED-PARTICLE-BEAM EXPOSURE APPARATUS COMPRISING SAME

(75) Inventor: Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/884,187

(22) Filed: Jun. 18, 2001

(65) Prior Publication Data

US 2002/0067585 A1 Jun. 6, 2002

(30) Foreign Application Priority Data

Jun. 20, 2000 (JP) .......................... 2000-184041

(51) Int. Cl.⁷ .............................................. H02N 13/00
(52) U.S. Cl. ......................................... 361/234; 361/128
(58) Field of Search ................................ 361/234, 128; 118/500, 728; 219/121.48

(56) References Cited

U.S. PATENT DOCUMENTS 6,377,437 B1 * 4/2002 Sexton et al. ................ 279/128

* cited by examiner

Primary Examiner—Shawn Riley
(74) Attorney, Agent, or Firm—Klarquist Sparkman LLP

(57) ABSTRACT

Electrostatic wafer chucks are disclosed for use in holding a substrate (e.g., semiconductor wafer) during processing of the substrate in a vacuum chamber or other reduced-pressure environment. A representative wafer chuck provides improved control of the vacuum level in the vacuum environment while providing a mechanism (lift pins) for raising and lowering the substrate relative to the chuck. The chuck body defines a wafer-mounting surface that contacts the under-surface of the substrate. The chuck body defines a gap between the under-surface of the substrate and the chuck for conducting a heat-transfer gas, and multiple feed-through holes extending through the chuck body. Surrounding each feed-through hole is at least a first protrusion configured to separate the respective feed-through hole from the gap. A respective lift pin in each feed-through hole extends from the chuck body across the gap to the under-surface of the substrate. The lift pins can move relative to the chuck body to lift the substrate relative to the wafer-mounting surface. The protrusions surrounding the feed-through holes prevent passage of heat-transfer gas through the feed-through holes.

12 Claims, 3 Drawing Sheets

ELECTROSTATIC WAFER CHUCKS AND CHARGED-PARTICLE-BEAM EXPOSURE APPARATUS COMPRISING SAME

FIELD OF THE INVENTION

This invention pertains to devices (termed "chucks") that hold a substrate, such as a semiconductor wafer coated with a "resist," while a process such as microlithography is being conducted on the substrate. Microlithography concerns the transfer of a pattern, usually defined by a reticle, mask, or the like, onto the resist-coated surface of the substrate using an energy beam. Microlithography is a key technology used in the manufacture of microelectronic devices such as integrated circuits, displays, and the like. More specifically, the invention pertains to electrostatic chucks that hold the substrate by electrostatic attraction (force) between the chuck and the substrate. Even more specifically, the invention pertains to electrostatic chucks configured to dissipate heat from the substrate to the chuck using a heat-transfer gas.

BACKGROUND OF THE INVENTION

As used herein, a "wafer" encompasses any of various types of substrates that can be held on a chuck, including semiconductor wafers, glass or ceramic plates, or any of various other suitable substrates.

In various microlithographic exposure processes involving the transfer of a pattern to a wafer, the upstream-facing surface ("process surface," usually coated with a suitable resist) of the wafer is irradiated by an energy beam such as a beam of electromagnetic radiation or a charged particle beam. Absorption of the beam energy by the wafer causes wafer heating. The temperature rise usually is accompanied by thermal expansion of the wafer. Normally, wafer heat is conducted and dissipated to the chuck to which the wafer is mounted. However, any particulate debris situated between the downstream-facing surface of the wafer and the wafer-mounting surface of the chuck can cause deformation of the wafer. This deformation decreases the accuracy and precision of exposures on the wafer.

To solve these problems associated with particulate contamination, multiple channels conventionally are machined into the wafer-mounting surface of the chuck, thereby forming respective "gaps" or spaces between the wafer and the chuck. To facilitate thermal conduction in the regions of the gaps, a heat-transfer gas conventionally is circulated through the channels while the wafer is mounted to the chuck. A typical heat-transfer gas is helium (He) gas. Circulation of the heat-transfer gas through the channels in this manner reduces thermal expansion of the wafer because the gas (which contacts the under-surface of the wafer in the gap regions) conducts heat from the wafer to the gas and from the gas to the chuck. Areas of the wafer-mounting surface in which channels are not formed contact the wafer directly and thus directly conduct heat from the wafer to the chuck.

Parameters influencing the amount and rate of thermal transfer to the chuck by the heat-transfer gas include the thermal conductivity of the gas, the gas pressure, the gas-flow rate, and transverse dimensions of the respective gaps. For instance, if the mean free path of molecules of the heat-transfer gas is longer than a minimum transverse dimension of a gap, then at relatively low gas pressure the thermal conductivity of the gas increases nearly proportionally with increases in gas pressure. However, if the mean free path is shorter than a minimum transverse dimension of a gap, then the thermal conductivity of the gas is essentially independent of gas pressure.

Especially for charged-particle-beam (CPB) microlithography, the chuck is situated in a vacuum chamber evacuated to a suitable vacuum level using a vacuum pump. Under such conditions, it is important that leakage of the heat-transfer gas from the chuck into the vacuum chamber be as low as possible. Excessive leakage of heat-transfer gas can compromise the performance of the vacuum pump to an extent such that the required vacuum level in the vacuum chamber is not achievable or maintainable. In such an event, adverse consequences may result such as reduced accuracy or precision of pattern transfer, or damage to the microlithography apparatus.

One conventional method for controlling leakage of heat-transfer gas involves providing a ring-shaped protrusion around the perimeter of the wafer-mounting surface of the chuck. Just inward (in the radial direction) of the protrusions are gas-exhaust ports for aspirating residual heat-transfer gas in the channels. Other methods include monitoring of the pressure of the heat-transfer gas and controlling the flow rate of the heat-transfer gas in gas inlets to the channels. These methods are generally acceptable for maintaining the pressure of the heat-transfer gas as constantly as possible during wafer exposure, thereby achieving effective transfer of heat away from the wafer.

In some microlithography apparatus, however, chucks are used that include a mechanism for moving the wafer vertically relative to the wafer-mounting surface to facilitate effective adhesion of the wafer to and detachment of the wafer from the chuck. Such mechanisms work in concert with a robot arm used for transporting the wafer to and from the chuck, and eliminate the need for the robot arm to move vertically relative to the chuck. Conventional mechanisms for vertical movement of the wafer relative to the chuck extend through feed-through holes in the surface of the chuck. The feed-through holes also facilitate pressure equalization allowing the wafer to be lifted off the chuck surface. Unfortunately, the feed-through holes provide conduits for escape of heat-transfer gas from the channels to the vacuum chamber, thereby causing undesired changes in pressure of the heat-transfer gas in the gaps and hindering wafer processing.

SUMMARY OF THE INVENTION

In view of the shortcomings of conventional devices and methods as summarized above, an object of the invention is to provide electrostatic chucks that can suppress leakage of heat-transfer gas more effectively from the gap between the wafer and the chuck, thereby more reliably maintaining the pressure of the heat-transfer gas in the gap.

To such end, and according to a first aspect of the invention, electrostatic chucks are provided for holding a substrate for processing. An embodiment of such a chuck comprises a chuck body. The chuck body defines a wafer-mounting surface configured to contact an under-surface of a substrate whenever the substrate is electrostatically mounted to the chuck. The chuck body also defines a gap between the under-surface of the substrate and the chuck whenever the substrate is mounted to the wafer-mounting surface, and multiple feed-through holes extending through a thickness dimension of the chuck body. The chuck body also defines a gas-inlet port situated and configured to conduct a heat-transfer gas to the gap so as to allow the heat-transfer gas to contact the under-surface of the substrate whenever the substrate is mounted to the wafer-mounting surface. The chuck body also defines a gas-exhaust port situated and configured to conduct the heat-transfer gas away from the gap. The chuck body also defines a respective first protrusion surrounding each feed-through hole, wherein the first protrusions are configured to separate the respective feed-through hole from the gap. The chuck embodiment also includes a respective lift pin situated in each feed-through hole. The lift pins are configured to extend from the chuck body across the gap to the under-surface of the substrate. The lift pins are actuatable relative to the chuck body so as to contact the under-surface of the substrate and cause lifting of the substrate relative to the wafer-mounting surface.

The chuck summarized above can include a gas-exhaust pump connected to the gas-exhaust port and configured to remove heat-transfer gas from the gap, and a gas supply connected to the gas-inlet port and configured to supply the heat-transfer gas to the gap.

The chuck body can further define a first peripheral protrusion extending circumferentially around the chuck body, wherein the peripheral protrusion has a height, relative to the chuck body, equal to a height of the respective first protrusions, around the feed-through holes, relative to the chuck body. In this configuration, the chuck body can define multiple gas-exhaust ports situated radially inwardly of the first peripheral protrusion.

The chuck body can further define a second peripheral protrusion extending circumferentially around the chuck body radially inwardly of the first peripheral protrusion, wherein the second peripheral protrusion has a height, relative to the chuck body, equal to the height of the first peripheral protrusion. In this configuration, the chuck body can define multiple gas-exhaust ports situated radially between the first and second peripheral protrusions.

The chuck body can further define, at each feed-through hole, a respective second protrusion surrounding the respective first protrusion, wherein the second protrusion also is configured to separate the respective feed-through hole from the gap. In this configuration, at each feed-through hole, the respective second protrusions desirably have a height, relative to the chuck body, equal to a height of the respective first protrusions. The chuck body can further define, at each feed-through hole, a respective gas-exhaust port situated between the first and second protrusions surrounding the respective feed-through hole. The chuck body can further define, at each feed-through hole, multiple respective gas-exhaust ports situated between the first and second protrusions surrounding the respective feed-through hole.

According to another aspect of the invention, microlithography apparatus are provided that comprise a chuck according to any of the embodiments summarized above.

With any of the various configurations according to the invention, the amount of heat-transfer gas escaping through the feed-through holes around the lift pins is substantially decreased compared to conventional chucks. This allows the pressure of the heat-transfer gas in the gap to be more accurately and reliably maintained during use of the chucks.

In the configurations in which the chuck body defines multiple protrusions surrounding each feed-through hole, especially with one or more gas-exhaust ports situated between the protrusions, leakage of heat-transfer gas from the gap is even further reduced.

The foregoing and additional features and advantages of the invention will be more readily apparent from the following detailed description, which proceeds with reference to the accompanying drawings.

DETAILED DESCRIPTION

The invention is described in the context of representative embodiments that are not intended to be limiting in any way.

Figure 1:
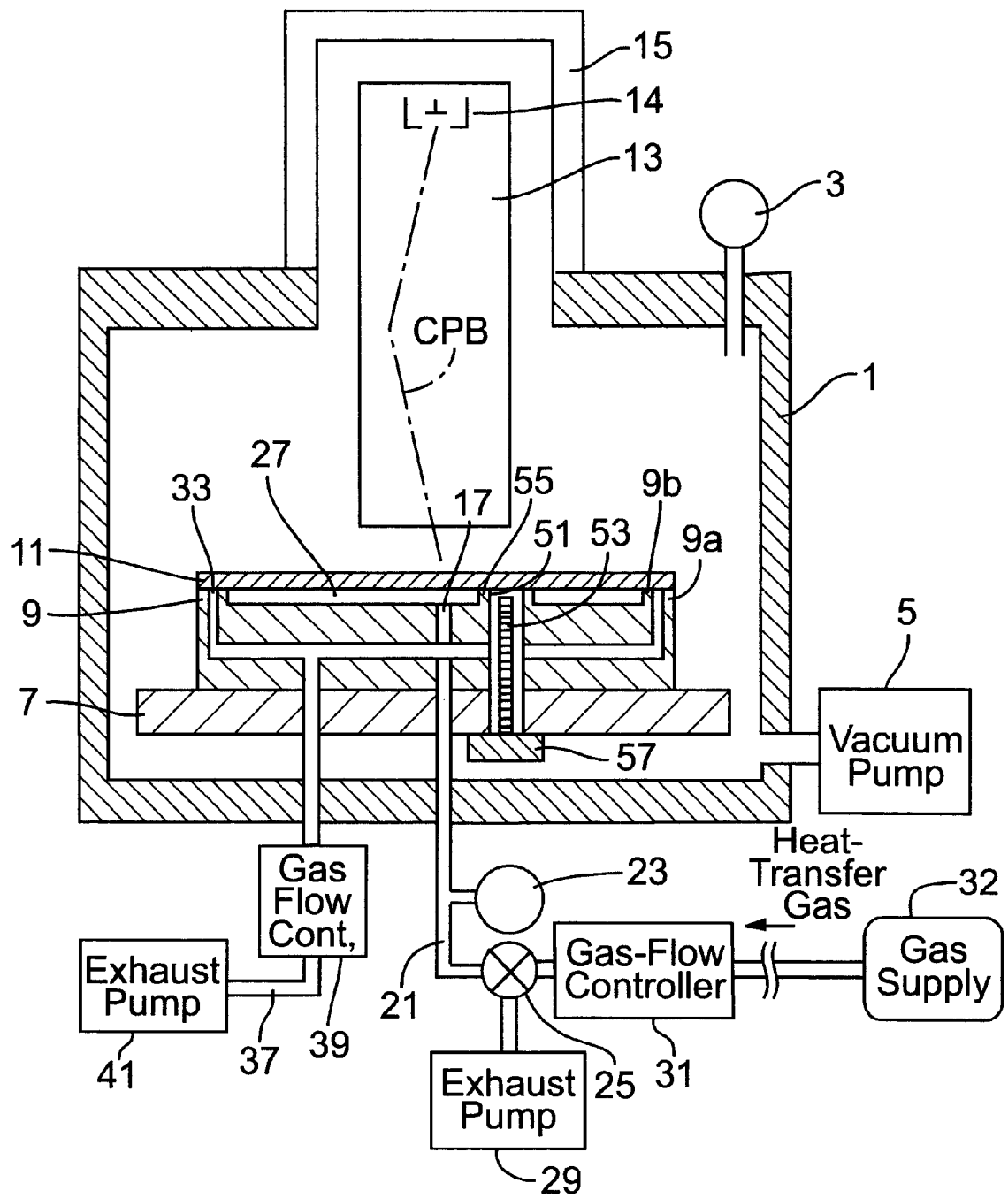
FIG. 1 is a schematic elevational (and partly sectional) view of a microlithographic exposure apparatus including an electrostatic chuck according to a first representative embodiment of the invention.

A first representative embodiment of an electrostatic chuck is shown in FIG. 1 in the context of a representative embodiment of a charged-particle-beam (CPB) microlithography apparatus according to the invention. Details of the electrostatic chuck are shown in FIGS. 2(A)–2(B).

Turning first to FIG. 1, a vacuum chamber 1 is shown that includes a lens column 15. The vacuum chamber 1 defines an interior space that is evacuated to a suitable vacuum level using a vacuum pump 5. The vacuum chamber 1 encloses an electrostatic chuck 9 situated on a wafer stage 7. The upstream-facing portion of the chuck 9 (i.e., upward-facing portion in the figure) includes the wafer-mounting surface (described below) on which a wafer 11 is mounted. Situated within the lens column 15 is a CPB optical system 13. The CPB optical system 13 typically includes an illumination-optical system and projection-optical system (not detailed but well understood in the art). Also located within the lens column 15 is a CPB source 14 (e.g., electron gun) situated at the extreme upstream end of the CPB optical system 13. The CPB source 14 produces a charged particle beam CPB that propagates in a downstream direction from the source 14 through the CPB optical system 13. As the beam CPB passes through the CPB optical system 13, the beam is shaped and deflected as required to form an image on the process surface (top surface in the figure) of the wafer 11.

As noted above, the vacuum pump 5 evacuates the atmosphere inside the vacuum chamber 1 so as to establish a desired vacuum level inside the vacuum chamber 1. The vacuum level is monitored by a vacuum gauge 3. By way of example, the inside of the vacuum chamber 1 is maintained at a vacuum level of $1.3 \times 10^{-3}$ Pa=$10^{-5}$ Torr.

Figure 2A:
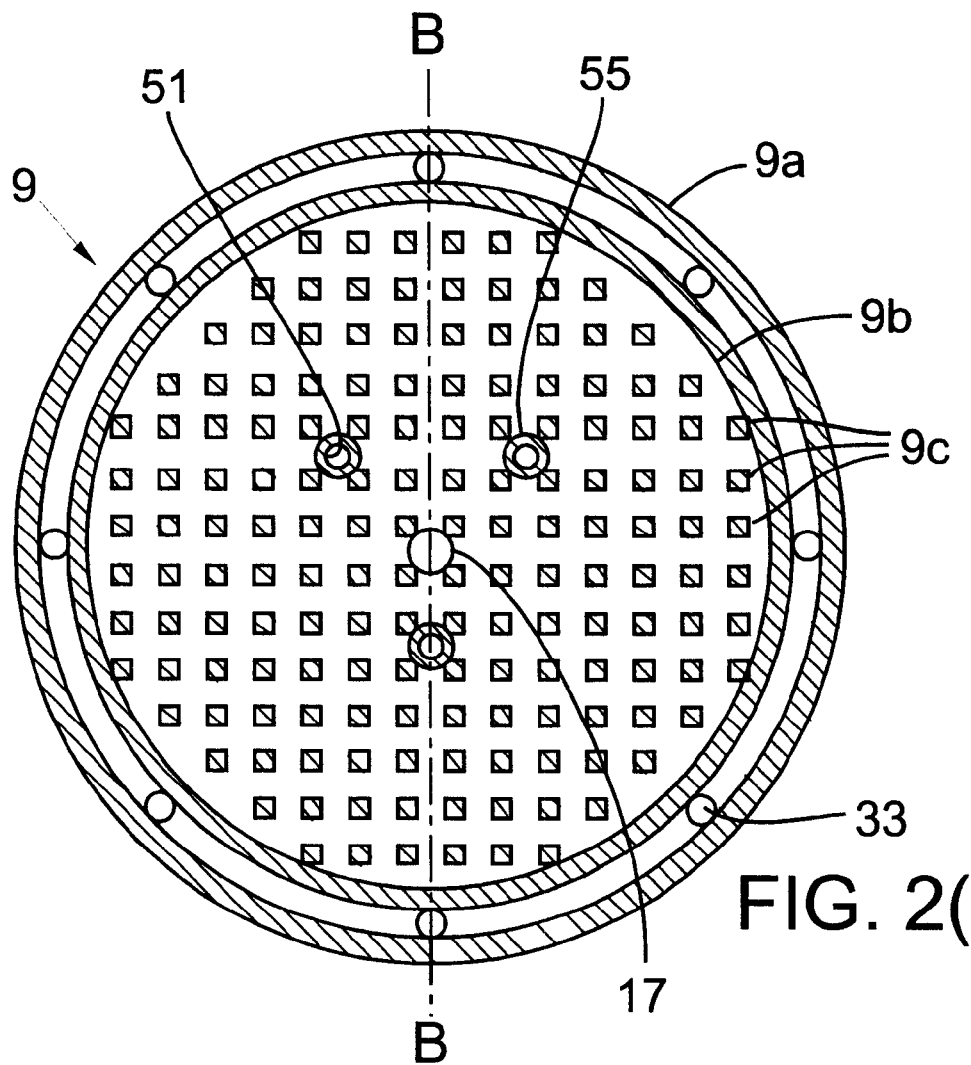
FIG. 2(A) is a plan view of the wafer-mounting surface and gas channels of the electrostatic chuck of the first representative embodiment.
Figure 2B:
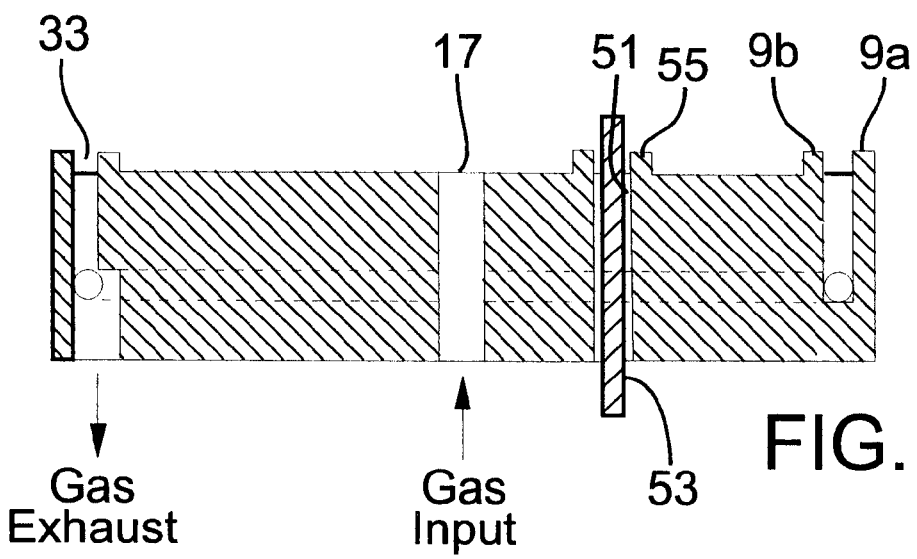
FIG. 2(B) is an elevational section along the line B—B in FIG. 2(A).

Details of the chuck 9 are shown in FIG. 2(A). In plan perspective, the chuck 9 is generally round in profile and defines an outer protrusion 9a extending around the perimeter of the chuck 9. An inner protrusion 9b also extends around the periphery of the chuck 9 but radially inward of the outer protrusion 9a. As shown in FIG. 2(B), both protrusions 9a, 9b have the same "height" (i.e., extend upward in the figure to the same vertical coordinate) and together constitute a double-ring feature. Multiple (eight are shown) gas-exhaust ports 33 are situated in a circle, equi-angularly relative to each other, between the protrusions 9a, 9b. The gas-exhaust ports 33 are commonly connected to a conduit 33c inside the chuck 9, and the conduit 33c extends to the bottom surface of the chuck 9, as shown in FIG. 2(B), to a gas-exhaust port 33p. A gas-inlet port 17 is defined at the bottom center of the chuck 9 and extends upward in the figure (i.e., toward the wafer-mounting surface) through the respective thickness dimension of the chuck 9. The gas-inlet port 17 also extends downward (in the figure) through the thickness dimension of the wafer stage 7, as shown in FIG. 1.

Radially inwardly of the inner protrusion 9b, a recess (gap) 27 is defined, e.g., by machining the upstream-facing surface of the chuck 9. In FIG. 2(A), the gap 27 extends away from the viewer from the plane of the page. Dispersed in an array throughout the gap 27 are multiple protrusions 9c that, in FIG. 2(A), extend toward the viewer. Each protrusion 9c terminates with a respective upstream-facing surface that functions as a respective part of the wafer-mounting surface of the chuck 9. I.e., each respective upstream-facing surface contacts the under-surface of the wafer 11 whenever the wafer is mounted to the chuck 9. To such end, the protrusions 9c all have the same "height," which is equal to the respective "heights" of the inner and outer protrusions 9b, 9a, respectively.

Whenever a wafer 11 is mounted to the chuck 9, the under-surface of the wafer 11 directly contacts the respective upstream-facing surfaces of the protrusions 9a, 9b, 9c. Meanwhile, the gap 27 between the wafer 11 and the chuck 9 is filled with a heat-transfer gas (e.g., He gas) supplied by the gas-inlet port 17. Thermal expansion of the wafer 11 is controlled by dissipating heat from the wafer 11 to the chuck 9 via the heat-transfer gas circulating in the gap 27. After passing through the gap 27, the heat-transfer gas exits through the gas-exhaust ports 33.

Also extending through the thickness dimension of the chuck 9 are multiple feed-through holes 51 (a desirable number of three are shown). The feed-through holes 51 desirably are arranged equilaterally in a central region of the upstream-facing surface of the chuck (FIG. 2(A). Surrounding each feed-through hole 51 is a respective circular protrusion 55 (FIG. 2(B)). The protrusions 55 separate the respective feed-through holes 51 from the gap 27. The protrusions 55 have the same "height" as the protrusions 9c. In FIG. 2(B), the upstream-facing surface of each protrusion 55 is a respective part of the wafer-mounting surface of the chuck 9 and thus contacts the under-surface of the wafer 11 whenever the wafer 11 is mounted to the chuck 9. In the depicted configuration in which the protrusions 55 are at the same "height" as the protrusions 9a, 9b, 9c, heat-transfer gas in the gap 27 does not escape through the feed-through holes 51 whenever a wafer 11 is mounted to the chuck 9.

Normally, a vacuum is maintained inside the feed-through holes 51. By maintaining a vacuum in the feed-through holes, during exchange of wafers 11 on the chuck 9, gas will tend to enter the feed-through holes 51 and thus be evacuated from the vacuum chamber 1.

A respective lift pin 53 is disposed coaxially inside each feed-through hole 51 (the lift pin is not shown in FIG. 2(A)). In FIG. 1, respective drive units 57 are mounted on the under-surface (in the figure) of the wafer stage 7, below the lift pins 53. The drive units 57 are actuated as required to cause the lift pins 53 to move upward or downward in the figure in a coordinated manner relative to the chuck 9 and wafer stage 7. As the lift pins 53 are driven upward, their respective termini contact the under-surface of the wafer 11 and lift the wafer 11 relative to the chuck 9. Whenever the wafer 11 is in a lifted position relative to the chuck 9, as effected by the lift pins 53, the lift pins 53 extend above the wafer-mounting surface of the chuck 9 as shown in FIG. 2(B). Whenever the wafer 11 is affixed to the wafer-mounting surface of the chuck 9, the lift pins 53 are recessed into their respective feed-through holes 51, as shown in FIG. 1.

Even though the feed-through holes 51 and lift pins 53 are shown in FIG. 2(A) uniformly disposed about a circle in three respective locations, the feed-through holes 51 and lift pins 53 are not limited to such a configuration. It will be immediately apparent that any of various configurations and number of lift pins (and respective feed-through holes) can be used. However, three lift pins spaced as shown in FIG. 2(A) are especially advantageous from the standpoint of economy and efficiency in supporting the wafer 11 in a secure tripod manner.

Electrodes (not shown but well understood in the art) are embedded in the chuck 9 for generating the electrostatic force required to hold the wafer 11 to the chuck 9. The electrostatic force is produced by applying a voltage across the electrodes. When mounted to the chuck 9 in this manner, the under-surface of the wafer 11 is affixed to and in direct contact with the wafer-mounting surface, as collectively defined by the respective upstream-facing surfaces of the protrusions 55 and 9a–9c.

The heat-transfer gas enters the gap 27 via a gas-inlet conduit 21 connected on its downstream end to the gas-inlet port 17 on the under-surface of the chuck 9 (FIG. 1). The gas-inlet conduit 21 includes a pressure gauge or sensor 23 for monitoring the pressure in the conduit 21. At the upstream end of the gas-inlet conduit 21 is a gas-flow controller 31 connected via a 3-way valve 25 to the gas-inlet conduit 21. A gas supply (e.g., gas cylinder) 32 is connected to the gas-inlet conduit 21 upstream of the gas-flow controller 31. The gas supply 32 provides a source of the heat-transfer gas (e.g., He gas).

The 3-way valve 25 also is connected to an exhaust pump 29. The 3-way valve 25 can be actuated to open the connection of the exhaust pump 29 to the conduit 21 while simultaneously closing the connection of the gas-flow controller 31 to the conduit 21. This allows residual heat-transfer gas in the conduit 21 to be exhausted.

To exhaust the heat-transfer gas from the gap 27, an upstream end of a gas-exhaust conduit 37 is connected to the gas-exhaust port 33p on the under-surface of the chuck 9 (FIG. 1). The upstream end of the gas-exhaust conduit 37 includes a gas-flow controller 39 connected to an exhaust pump 41.

Operation of the wafer chuck 9 shown in FIGS. 1 and 2(A)–2(B) is as follows. When removing the wafer 11 from the chuck 9, most of the residual heat-transfer gas present in the gap 27 and gas conduits 21, 37 is exhausted using the exhaust pumps 29, 41. Any other heat-transfer gas (a very small amount) that escapes into the vacuum chamber 1 is exhausted using the vacuum pump 5. Thus, a sufficiently high vacuum is maintained inside the vacuum chamber 1.

A wafer 11 is placed on the wafer-mounting surface of the chuck 9 using a robot arm (not shown but well understood in the art). Alternatively, the wafer 11 can be placed on the chuck 9 manually. At the time of wafer placement on the chuck 9, the lift pins 53 already have been actuated so as to extend above the plane of the wafer-mounting surface. For example, the lift pins 53 already are "raised" in this manner because they previously had to be raised to allow removal of the previous wafer 11 from the chuck 9. In any event, the fresh wafer 11 is placed on the tips of the raised lift pins 53.

After placing the wafer on the tips of the lift pins 53, the robot arm is retracted and the drive units 57 are actuated to simultaneously retract (lower) the lift pins 53. At the instant the lift pins 53 are lowered below the plane of the wafer-mounting surface, the wafer 11 comes to rest on the wafer-mounting surface. At this time, the electrodes embedded in the chuck 9 are energized to cause electrostatic attraction of the wafer 11 to the chuck 9.

Proper attachment of the wafer 11 to the wafer-mounting surface typically is confirmed using a wafer-adhesion-check electrode (not shown but well understood in the art). Thus, a confirmation is made that the wafer 11 is mounted securely to the wafer chuck 9. Upon a successful confirmation, the heat-transfer gas can be introduced into the gap 27. To such end, the 3-way valve 25 is switched to open the connection from the gas-flow controller 31 to the downstream conduit 21. This allows heat-transfer gas to pass from the gas supply 32 through the gas-flow controller 31, the 3-way valve 25, the gas-inlet conduit 21, and the gas-inlet port 17 into the gap 27. During this passage of heat-transfer gas, the flow rate of the heat-transfer gas is controlled by the gas-flow controllers 31, 39 as the pressure of the heat-transfer gas inside the gap 27 is monitored using the pressure gauge 23. Meanwhile the connection of the exhaust pump 39 to the conduit 21 is turned off by the 3-way valve 25. The target value of pressure of the heat-transfer gas inside the gap 27 is based on achieving a balanced electrostatic force between the chuck 9 and the wafer 11. By way of example, a target pressure is 1.3 kPa (10 Torr).

After the target pressure has been achieved inside the gap 27, exposure of the wafer 11 can begin. During exposure of the wafer 11, the vacuum level inside the vacuum chamber 1 is monitored using the chamber-pressure gauge 3. If, for example, the under-surface of the wafer 11 has significant surficial irregularities, a small amount of heat-transfer gas can escape during exposure. Such escape of heat-transfer gas would cause a drop in vacuum level in the vacuum chamber 1 as detected by the chamber-vacuum gauge 3. If such a condition should arise, then the vacuum pump 5 would be activated to return the vacuum level to the target value.

However, if heat-transfer gas escapes into the vacuum chamber at a rate exceeding the pumping rate of the vacuum pump 5, then the vacuum level in the chamber 1 would deteriorate. In such a case, the gas-flow controller 39 would enact an adjustment to increase the gas-exhaust flow rate, thereby decreasing the leakage of heat-transfer gas. This would cause the pressure of heat-transfer gas in the gap 27 to decrease, but the pressure can be returned to the target value quickly by an appropriate adjustment enacted by the gas-flow controller 31.

The concept of adjusting the heat-transfer gas pressure is as follows. First, if the pressure of heat-transfer gas is adjusted so as to make the mean free path of the gas molecules shorter than a transverse dimension of the gap 27, then the magnitude of heat transfer will be essentially independent of gas pressure. Hence, the pressure of heat-transfer gas in the gap 27 is controlled by the gas-flow controller 31 so that the mean free path of the gas molecules is shorter than the transverse dimensions of the gap.

Now consider alleviating a drop in heat transfer (i.e., a decrease in wafer-cooling capacity) due to a decrease in pressure of heat-transfer gas when the gas-exhaust flow rate is increased by an adjustment enacted by the gas-flow controller 39, as described above. For instance, consider use of He gas as the heat-transfer gas and consider a gap "depth" of 100 $\mu$m. If the mean free path of He-gas molecules is 100 $\mu$m and the temperature is 300 K, then the pressure of He gas is approximately 2 Torr. Consequently, the pressure of introduced He gas is controlled by the gas-flow controller 31 to, e.g., 10 Torr. By controlling the pressure of the introduced heat-transfer gas in this manner, if the pressure inside the gap 27 decreases, as described above, then a time surplus is provided from when the pressure is 10 Torr until it drops to 2 Torr. Meanwhile, if the mean free path is shorter than a transverse dimension of the gap, then the heat-transfer efficiency is essentially independent of gas pressure. Hence, heat transfer will remain essentially unchanged even when the pressure changes from 10 Torr to 2 Torr, with no effect on exposure.

Events occurring when exposure is completed are as follows. At the moment residual heat-transfer gas is removed by the exhaust pump 41, the 3-way valve closes off the connection to the gas-flow controller 31 and opens the connection to the exhaust pump 29. Then, the exhaust pump 29 is turned on to exhaust the residual heat-transfer gas from the gap 27 and conduit 21. Any heat-transfer gas that has escaped into the vacuum chamber 1 is removed by the vacuum pump 5 while maintaining the desired vacuum level in the vacuum chamber 1. After residual heat-transfer gas in the gap 27 has been exhausted, electrical power to the electrodes is turned off. The drive units 57 are actuated so as to drive the respective lift pins 53 upward in a simultaneous manner. The robot arm is inserted under the wafer 11 (which has been lifted upward by the lift pins 53). The robot arm lifts the wafer 11 from the pins 53 and removes the wafer to outside the vacuum chamber 1.

Figure 3A:
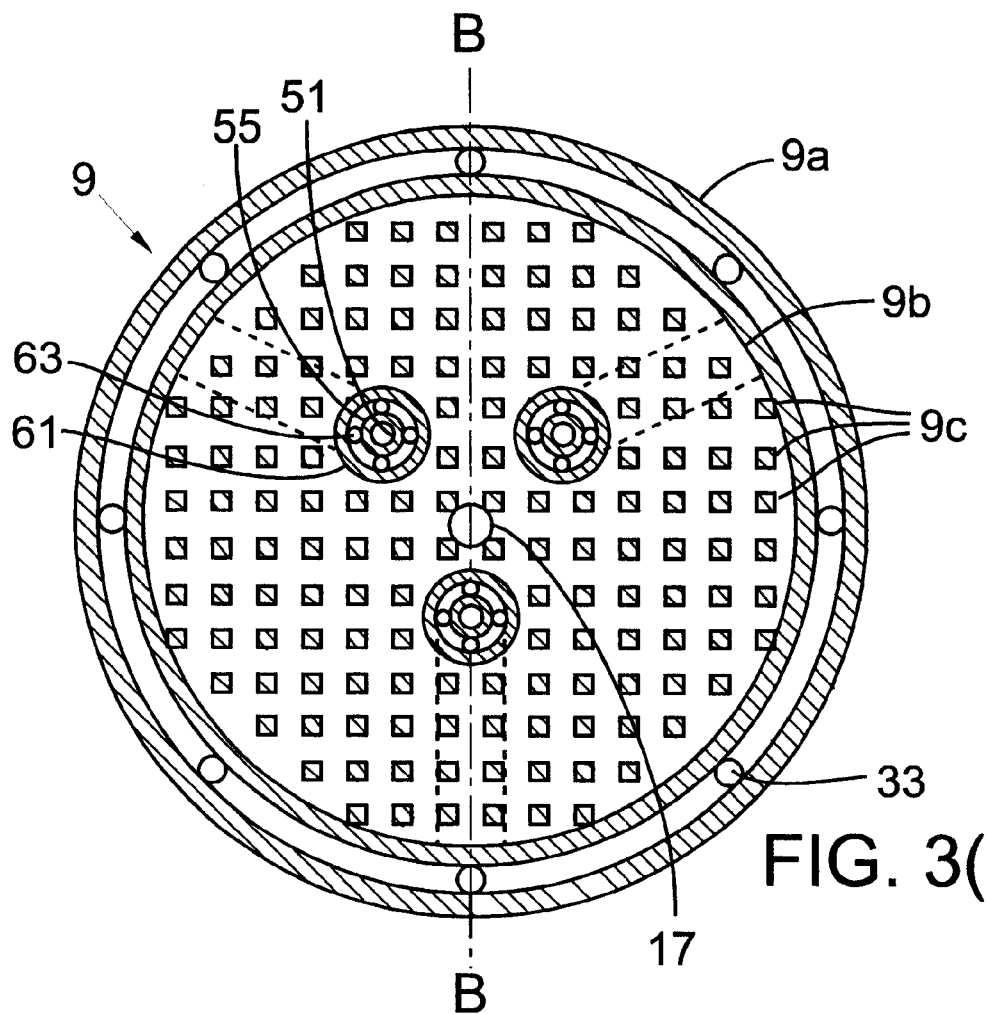
FIG. 3(A) is a plan view of the wafer-mounting surface and gas channels of an electrostatic chuck according to a second representative embodiment of the invention.
Figure 3B:
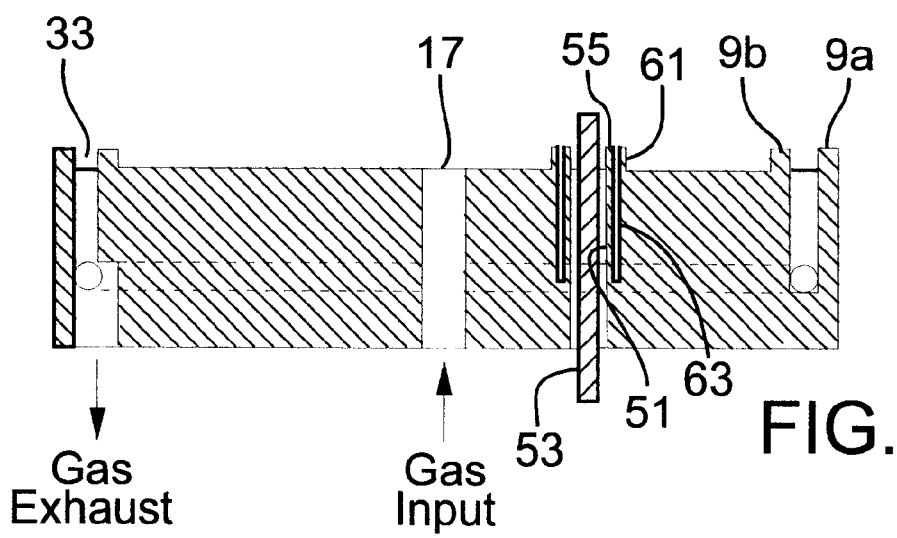
FIG. 3(B) is an elevational section along the line B—B in FIG. 3(A).

An electrostatic chuck according to a second representative embodiment is depicted in FIGS. 3(A)–3(B), in which components that are similar to those shown in FIGS. 2(A)–2(B) have the same respective reference numerals. The chuck 9 has a circular configuration as shown in FIG. 3(A). The periphery of the chuck includes an outer protrusion 9a and inner protrusion 9b, as described in the first representative embodiment. Between the protrusions 9a, 9b are multiple, equiangularly placed gas-exhaust ports 33 (eight are shown). The gas-exhaust ports 33 are commonly connected inside the chuck 9 via a conduit 33c that extends to the under-surface of the chuck 9, as shown in FIG. 3(B). A gas-inlet port 17 is defined at the center of the chuck 9 and extends through the thickness dimension of the chuck 9, as shown in FIG. 3(B).

The chuck 9 defines a gap 27 extending across the upstream-facing surface of the chuck 9 radially inside the inner protrusion 9b, as described above in connection with the first representative embodiment. The gap 27 includes multiple protrusions 9c in an array. The upstream-facing surfaces of the protrusions 9c contact the under-surface of the wafer whenever the wafer is mounted to the chuck 9. The upstream-facing surfaces of the protrusions 9a, 9b, and 9c are co-planar and define the wafer-mounting surface of the chuck 9 that contacts the under-surface of the wafer 11. Whenever the wafer 11 is mounted to the chuck 9, the gap 27 between the wafer 11 and the chuck 9 is filled with a heat-transfer gas (e.g., He gas) from a gas-inlet port 17.

The chuck 9 also defines multiple (three are shown) feed-through holes 51 extending through the thickness dimension of the chuck 5 as described above in the first representative embodiment. The feed-through holes 51 are surrounded by respective protrusions 55. The upstream-facing surface of each protrusion 55 is coplanar with the wafer-mounting surface of the chuck. In contrast to the first representative embodiment in which each feed-through hole 51 is surrounded only by a single respective protrusion 55, in the second representative embodiment each protrusion 55 is surrounded by a second protrusion 61 having the same "height" as the respective protrusion 55. The upstream-facing surface of each second protrusion 61 also is co-planar with the wafer-mounting surface of the chuck. Thus, around each feed-through hole 51, the respective protrusions 55, 61 form a respective double-ring configuration.

Between the protrusions 55, 61 at each feed-through hole 51, multiple (four are shown) gas-exhaust ports 63 are defined. These gas-exhaust ports 63 are connected to the gas-exhaust conduits 33c inside the chuck 9, as shown in FIG. 3(B). Since the protrusions 55, 61 have the same "height," the under-surface of the wafer 11 and the upstream-facing surfaces of the protrusions 55, 61, 9a, 9b, 9c contact each other snugly whenever the wafer 11 is resting on the wafer-mounting surface of the chuck 9. Thus, the heat-transfer gas in the gap 27 is prevented from escaping through the feed-through holes 51 whenever a wafer 11 is mounted to the chuck 9. This configuration also defines a structure that can be exhausted separately, making it difficult for heat-transfer gas to escape through the feed-through holes 51 (a vacuum usually is maintained inside the feed-through holes 51).

A respective lift pin 53 (not shown in FIG. 3(A)) is disposed inside each feed-through hole 51. The lift pins are actuated by respective drive units 57 mounted on the under-surface of the stage 7. The drive units 57 are actuated as required to drive the respective lift pins 53 up and down in the figure.

Electrodes (not shown but well understood in the art) are embedded in the chuck 9. An electrostatic force is generated between the chuck 9 and the wafer 11 by applying a voltage to the electrodes. The resulting electrostatic force urges the under-surface of the wafer 11 against the wafer-mounting surface of the chuck 9.

The double-ring configuration of the protrusions 55, 61 about each feed-through hole 51 ameliorates leakage of heat-transfer gas through the feed-through holes 51. Leakage through the feed-through holes 51 can be reduced further using the gas-exhaust ports 63 situated between the protrusions 55, 61.

As can be understood from the foregoing, leakage of heat-transfer gas from the gap between the wafer and chuck is effectively suppressed according to the invention, allowing the pressure of the heat-transfer gas to be maintained reliably.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An electrostatic chuck for holding a substrate for processing, the chuck comprising:
a chuck body defining: (i) a wafer-mounting surface configured to contact an under-surface of a substrate whenever the substrate is electrostatically mounted to the chuck, (ii) a gap between the under-surface of the substrate and the chuck whenever the substrate is mounted to the wafer-mounting surface, (iii) multiple feed-through holes extending through a thickness dimension of the chuck body; (iv) a gas-inlet port situated and configured to conduct a heat-transfer gas to the gap so as to allow the heat-transfer gas to contact the under-surface of the substrate whenever the substrate is mounted to the wafer-mounting surface, (v) a gas-exhaust port situated and configured to conduct the heat-transfer gas away from the gap, and (vi) a respective first protrusion surrounding each feed-through hole, the protrusion being configured to separate the respective feed-through hole from the gap; and
a respective lift pin situated in each feed-through hole, the lift pins configured to extend from the chuck body across the gap to the under-surface of the substrate, the lift pins being actuatable relative to the chuck body so as to contact the under-surface of the substrate and cause lifting of the substrate relative to the wafer-mounting surface.

2. The chuck of claim 1, further comprising:
a gas-exhaust pump connected to the gas-exhaust port and configured to remove heat-transfer gas from the gap; and
a gas supply connected to the gas-inlet port and configured to supply the heat-transfer gas to the gap.

3. The chuck of claim 1, wherein the chuck body further defines a first peripheral protrusion extending circumferentially around the chuck body, the peripheral protrusion having a height, relative to the chuck body, equal to a height of the respective first protrusions, around the feed-through holes, relative to the chuck body.

4. The chuck of claim 3, wherein the chuck body defines multiple gas-exhaust ports situated radially inwardly of the first peripheral protrusion.

5. The chuck of claim 3, wherein the chuck body defines a second peripheral protrusion extending circumferentially around the chuck body radially inwardly of the first peripheral protrusion, the second peripheral protrusion having a height, relative to the chuck body, equal to the height of the first peripheral protrusion.

6. The chuck of claim 5, wherein the chuck body defines multiple gas-exhaust ports situated radially between the first and second peripheral protrusions.

7. The chuck of claim 1, wherein the chuck body further defines, at each feed-through hole, a respective second protrusion surrounding the respective first protrusion, the second protrusion also being configured to separate the respective feed-through hole from the gap.

8. The chuck of claim 7, wherein, at each feed-through hole, the respective second protrusions have a height, relative to the chuck body, equal to a height of the respective first protrusions.

9. The chuck of claim 7, wherein the chuck body further defines, at each feed-through hole, a respective gas-exhaust port situated between the first and second protrusions surrounding the respective feed-through hole.

10. The chuck of claim 9, wherein the chuck body further defines, at each feed-through hole, multiple respective gas-exhaust ports situated between the first and second protrusions surrounding the respective feed-through hole.

11. A microlithography apparatus, comprising a chuck as recited in claim 1.

12. A microlithography apparatus, comprising a chuck as recited in claim 7.

* * * * *